United States Patent [19]

Siegel

[11] Patent Number: 4,462,871

[45] Date of Patent: Jul. 31, 1984

[54] EPITAXIAL THINNING PROCESS

[75] Inventor: Clifford M. Siegel, Charlottesville, Va.

[73] Assignee: The United States of America as represented by the Administrator of the National Aeronautics and Space Administration, Washington, D.C.

[21] Appl. No.: 366,103

[22] Filed: Apr. 6, 1982

[51] Int. Cl.$^3$ .............................................. C25D 11/32
[52] U.S. Cl. .................................. 204/1 T; 204/56 R; 204/37.6; 324/158 D; 324/158 T
[58] Field of Search ............... 204/1 T, 35 R, 35 N, 204/38 A, 56 R; 324/158 D, 158 T

[56] References Cited

U.S. PATENT DOCUMENTS 3,117,899  1/1964  McLouski ..................... 156/17
3,250,693  5/1966  Amaya ......................... 204/143
3,658,672  4/1972  Norris ......................... 204/164

*Primary Examiner*—G. L. Kaplan
*Assistant Examiner*—William T. Leader
*Attorney, Agent, or Firm*—Paul F. McCaul; Thomas H. Jones; John R. Manning

[57] ABSTRACT

A method is described for thinning an epitaxial layer (16) of a wafer (12) that is to be used in producing diodes having a specified breakdown voltage and which also facilitates the thinning process. Current is passed through the epitaxial layer, by connecting a current source between the substrate (14) of the wafer and an electrolyte (20) in which the wafer is immersed. When the wafer is initially immersed, the voltage across the wafer initially drops and then rises at a steep rate (from 56 to 58). When light is applied to the wafer the voltage drops (from 60 to 62), and when the light is interrupted the voltage rises again (from 66 to 68). These changes in voltage, each indicate the breakdown voltage of a Schottky diode that could be prepared from the wafer at that time. The epitaxial layer is thinned by continuing to apply current through the wafer while it is immersed and light is applied, to form an oxide film (24) and when the oxide film is thick the wafer can then be cleaned of oxide and the testing and thinning continued. Uninterrupted thinning can be achieved by first forming an oxide film, and then using an electrolyte that dissolves the oxide about as fast as it is being formed, to limit the thickness of the oxide layer.

11 Claims, 3 Drawing Figures

EPITAXIAL THINNING PROCESS

ORIGIN OF THE INVENTION

The invention described herein was made in the performance of work under a NASA Contract and is subject to the provisions of Section 305 of the National Aeronautics and Space Act of 1958, Public Law 85-568 (72 Stat. 435; 42 USC 2457).

BACKGROUND OF THE INVENTION

It is often necessary to produce Schottky barrier diodes of closely controlled breakdown voltage. The breakdown voltage is controlled by the thickness of an epitaxial layer on a gallium arsenide substrate, and the breakdown voltage is reduced from a high level to the desired level by reducing the thickness of the epitaxial layer. Such thinning can be accomplished by immersing the wafer containing the epitaxial layer, in an electrolyte of nearly neutral pH and passing a current from the substrate through the layer and into the electrolyte. The current oxidizes atoms at the face of the layer that is closest to the electrolyte, and this oxide can be washed away to produce a thinner layer. However, it is difficult to determine when the thinning should be stopped to achieve the desired breakdown voltage in diodes constructed from the wafer.

The oxide film formed during anodic oxidation is electrically insulative. Accordingly, when the voltage applied between the wafer substrate and electrolyte reaches a predetermined maximum value, the current flow progressively decreases as the oxide thickness grows, and therefore the rate of thinning decreases. To increase the thinning rate, the wafer can be removed and cleaned of oxide, and then again immersed in electrolyte and thinned again. However, such repeated removals complicate and lengthen the thinning process. Epitaxial thinning processes which facilitate the monitoring of the breakdown voltage characteristics of the epitaxial layers, and/or which simplify and speed up the layer thinning, would be of considerable value.

SUMMARY OF THE INVENTION

In accordance with one embodiment of the present invention, a process is described for thinning an epitaxial layer of a wafer, which facilitates the determination of the voltage breakdown characteristics of the epitaxial layer. The wafer is immersed in an electrolyte and a current source is connected between the wafer substrate and the electrolyte. Rapid changes in voltage are measured between the substrate and the electrolyte during the thinning process, either when the wafer is first immersed without light being applied, or during later brief interruptions of applied light. The amount of voltage change indicates the breakdown voltage characteristics of the epitaxial layer. In one method, after a thin oxide layer has been formed during the application of light, the light is briefly interrupted and the voltage increase and/or decrease are measured when light is respectively switched off and then switched on. The change of voltage is approximately equal to the breakdown voltage of Schottky diodes that can be produced from the wafer at that stage of its processing. In another method, a current source is connected between the cleaned wafer (no oxide film) and an electrolyte, and the wafer is immersed in the electrolyte, which produces a sudden drop in voltage followed by a fast rise and then a slower rise. The voltage reached at the end of the fast rise is also approximately equal to the breakdown voltage of a diode constructed from the wafer.

In one process for thinning an epitaxial layer on a substrate, the wafer is immersed in an electrolyte and current is flowed through the epitaxial layer from the wafer to the electrolyte to form a thin oxide film. An electrolyte is chosen that dissolves the oxide film material. The voltage applied through the wafer, and the dissolving strength of the electrolyte, are chosen so that the oxide film is dissolved away about as fast as it is formed, to maintain a somewhat constant thickness of oxide film. This prevents rapid build-up of the oxide film, to avoid the need for repeated withdrawals of the wafer from the electrolyte to clean off the oxide. During the thinning process, the breakdown voltage characteristics of the epitaxial layer can be determined by stopping the application of light, and noting the resulting rise of voltage, which is approximately equal to the breakdown voltage of a diode constructed from the wafer at that stage of its thinning.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
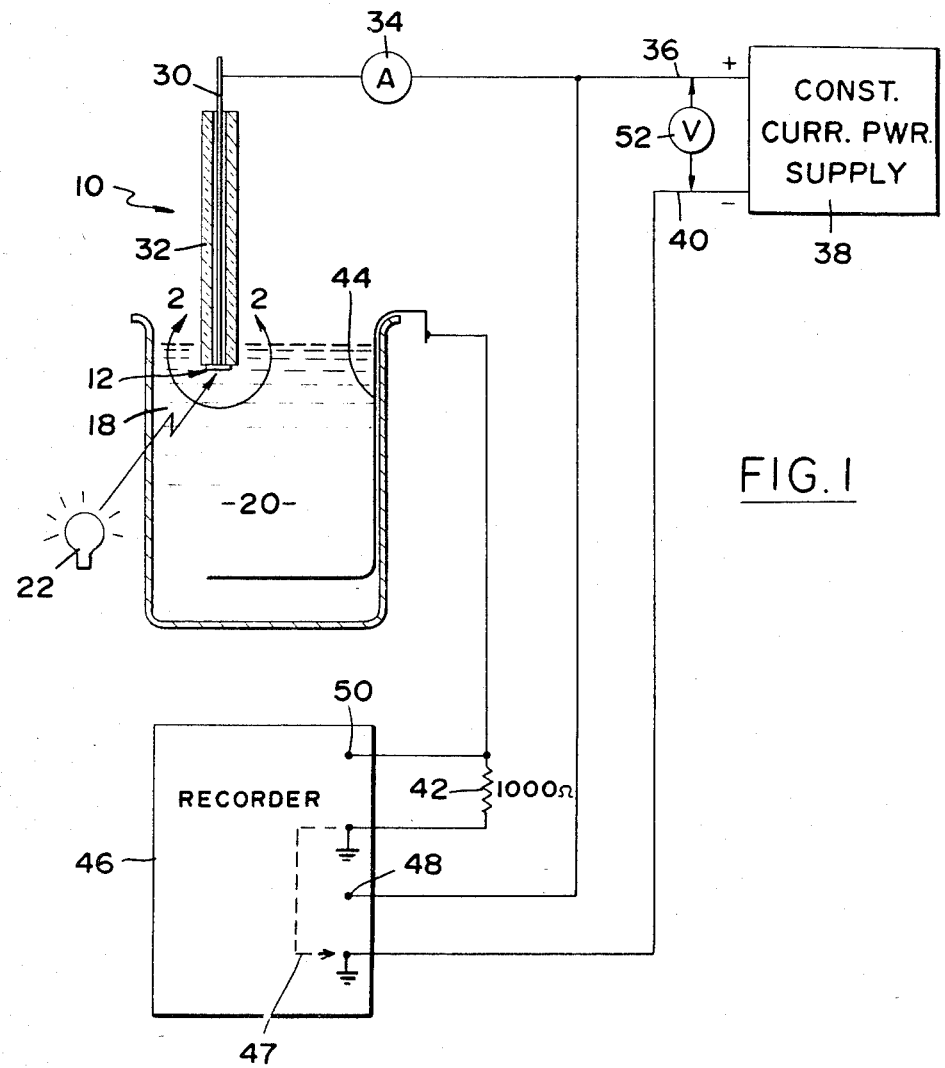
FIG. 1 is a sectional and block diagram view of a thinning apparatus used in accordance with the present invention.
Figure 2:
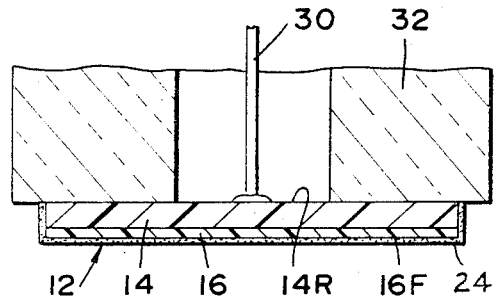
FIG. 2 is a view of the area 2—2 of FIG. 1.

FIG. 1 illustrates a system 10 which can be used to process a gallium arsenide wafer 12 that will be used to form Schottky diodes with breakdown voltages of a predetermined value. As shown in FIG. 2, the wafer 12 includes a relatively thick substrate 14 on which an epitaxial layer 16 has been grown. The thickness of the epitaxial layer 16 determines the breakdown voltage of diodes constructed from the wafer. The wafer is supplied by a manufacturer with an epitaxial layer 16 thicker than is required to produce the desired breakdown voltage, so that the layer 16 must be thinned by a precisely controlled amount to achieve the desired breakdown voltage. This is accomplished by immersing the wafer 12 in a bath 18 of electrolyte 20, applying sufficient light from a lamp 22 to create enough holes in the wafer for support of an appreciable current, and passing such a current through the wafer and into the electrolyte. The current passes through the epitaxial layer 16, and oxidizes a face 16F of the layer which is closest to the electrolyte. As current flows, the thickness of the oxide film 24 increases while the thickness of the epitaxial layer 16 decreases. The oxide layer 24 can be dissolved away, so that when the epitaxial layer has reached a desired thickness, it can be cleaned of oxide to prepare the wafer for use in constructing diodes.

It has been difficult to determine when the thinning of the epitaxial layer 16 should be stopped. In accordance with one aspect of the present invention, the breakdown voltage that will be observed in diodes constructed from the wafer is determined at any time by switching (on or off) the application of light to the wafer, and measuring the change in voltage across the epitaxial layer and the oxide film, as measured between the substrate 14 of the wafer and the surrounding electrolyte. This change in voltage across the epitaxial layer is found to be close to the breakdown voltage of diodes formed from the wafer. In experiments conducted with gallium arsenide wafers, the average diode breakdown voltage was about ½ volt less than than the change in voltage obtained by switching the light application between bright light and almost no light. The difference between the voltage change during processing and the diode breakdown voltage varied, with the variation largely due to nonuniformity in the epitaxial layer thickness as supplied by the wafer manufacturer.

In the illustrated system 10 for thinning an epitaxial layer, a conductive rod 30 was electrically connected to a rearward face 14R of the wafer 12, and the rearward face of the wafer was attached to an end of a glass tube 32. The conductive rod 30 was connected through an ammeter 34 to the positive side 36 of a power supply 38. The negative side 40 of the power supply was essentially connected through a resistor 42 to an electrode 44 that was immersed in the electrolyte 20. In practice, connections were made through a chart recorder 46, with current flowing through the recorder along the arrow indicated at 47. The chart recorder included one input 48 representing the voltage (above ground) applied to the wafer, and another input 50 representing the current (to ground) applied through the wafer. A volt meter 52 indicated the voltage across the power supply, which is substantially the same as the voltage input at 48 to the recorder. The power supply 38 was a constant current, voltage-limiting power supply, which would apply a predetermined current such as 0.5 milliampere per square centimeter of the wafer up to a selectable maximum voltage such as 26 volts.

Figure 3:
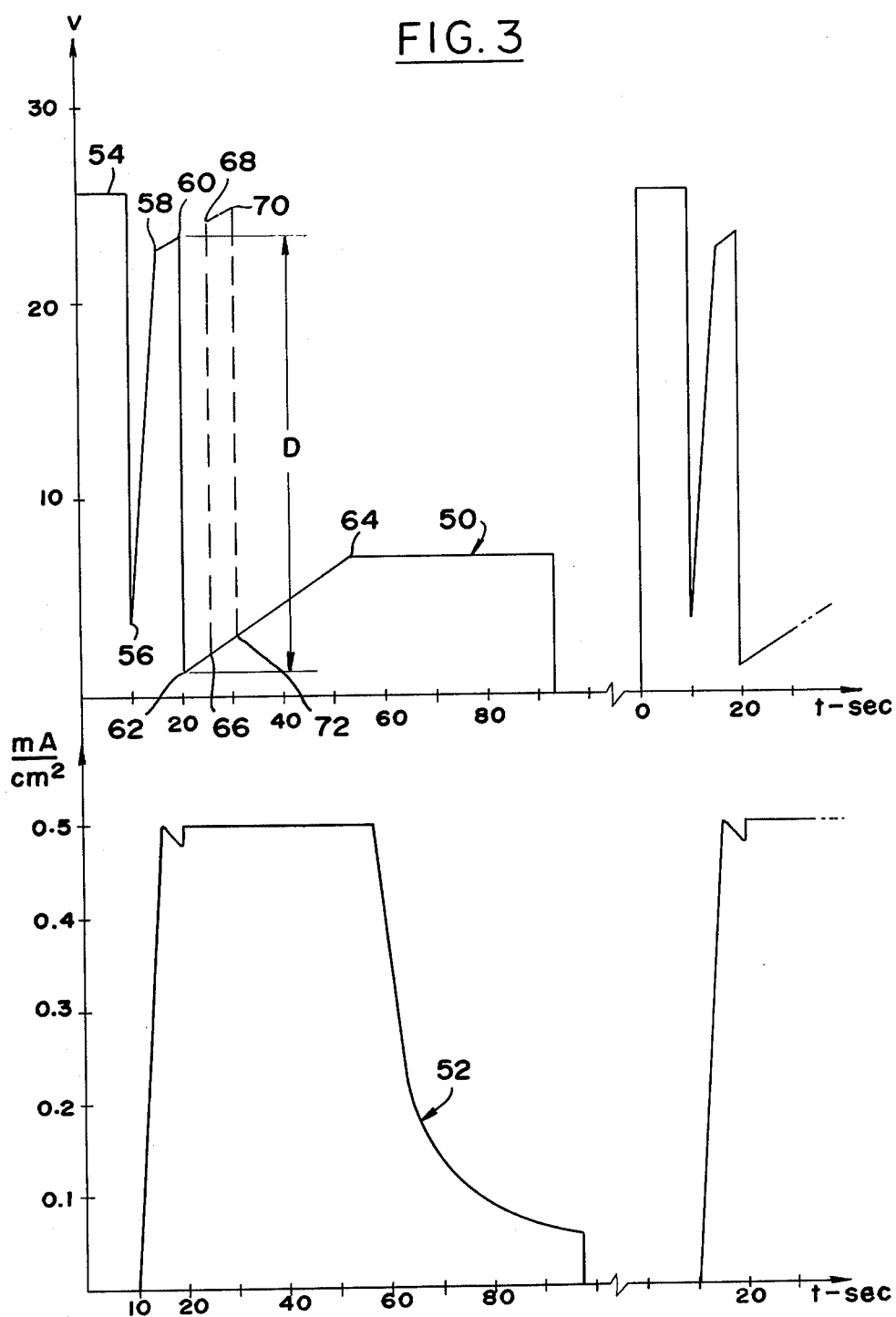
FIG. 3 contain graphs showing the variation in voltage and current measured by the apparatus in FIG. 1 during a thinning process.

To begin a thinning operation, the power supply 38 was turned on, and the wafer 12 was immersed in the electrolyte 20. After a period of several seconds, the lamp 22 was turned on to illuminate the front side of the wafer 12 on which the epitaxial layer 16 had been grown. FIG. 3 contains graphs 50, 52 showing the variations in voltage and current, respectively, with time, during the processing of the wafer.

The voltage graph 50 shows that the initial voltage at 54, prior to immersion of the wafer in the electrolyte, is the maximum voltage output of the power supply, which exists when substantially no current is supplied. When the wafer was initially immersed (with no light applied) the voltage immediately dropped to point 56 and then underwent a fairly rapid rise in voltage with time, such as about 5 volts per second, up to the point 58. After the point 58, the rate of voltage increase was at a suddenly lower level such as about 1/10th volt per second. At the point 60, the lamp 22 was turned on to brightly illuminate the wafer. The voltage suddenly dropped to point 62, undergoing a sudden voltage drop D of about 22 volts. The light continued to be applied, and the voltage across the wafer continued to increase up to the point 64. After that point 64 was reached, the voltage remained constant while the current flow decreased, due to the voltage limiting characteristics of the power supply. The decreasing current resulted in a decreasing rate of oxidation of the epitaxial layer 16 of the wafer. In order to continue thinning at a moderately rapid rate, the wafer 12 was removed from the electrolyte and the oxide was removed by rinsing in diluted hydrocloric acid, rinsing in deionized water, and blow drying with nitrogen. The power supply was again applied, the wafer immersed, and the thinning process repeated, about a dozentimes in one process that reduced the breakdown voltage from about 22 volts to about 14 volts.

The voltage drop between points 60 and 62, occurring when the light was suddenly applied, provides an indication of the breakdown voltage characteristics of the wafer. That is, it indicates the breakdown voltage of a diode constructed from the wafer when the epitaxial layer is of the thickness then existing. As mentioned above, experiments with certain gallium arsenide wafers show that the average breakdown voltage of diodes constructed from the wafer were about ½ volt less than the voltage decrease. The thinning process can be continued with occasional turning off and on of the light to measure the voltage drop, until the voltage drop is at a predetermined distance (e.g. ½ volt) from the desired diode breakdown voltage. For example, where the diode breakdown voltage must be above but close to 6 volts, thinning may be stopped when the voltage drop D is 7½ volts, so the average diode voltage is 7 volts and almost all diodes made from the wafer are between 6 and 8 volts.

Instead of measuring the voltage drop D, it is also possible to measure the voltage at point 58. This voltage appears at the end of the fast primary rise that follows the initial drop accompanying immersing of the wafer in the electrolyte. Point 58 is the point at which the voltage increase suddenly changes to a slower rate. The voltage at point 58 is very nearly equal to the above-mentioned drop D. During the thinning process, it is also possible to measure the breakdown characteristics by interrupting the light, as at the point 66, and measuring the rise to the point 68, or the subsequent drop from point 70 to point 72 when the light is turned on again (these changes are about ½ volt below the diode breakdown voltage). However, in this case, care must be taken that the point 70 is below the maximum voltage applied by the power supply.

In thinning of an epitaxial layer of gallium arsenide by anodic oxidation, as described above, the electrolyte was formed by adding 3% tartaric acid powder to deionized water. The pH of the solution was adjusted to nearly neutral (pH of 6 to 7) by the addition of ammonium hydroxide ($NH_4OH$) with about 3% ammonium hydroxide required to obtain a pH of 7. This solution was then mixed with twice as much ethylene glycol. The resulting solution, containing 1% tartaric acid 1% ammonium hydroxide, 67% ethylene glycol, and the remainder water with a substantially neutral pH of about 7, was used to avoid damage to the surface of the clean (unoxidized) epitaxial layer.

In accordance with another aspect of the invention, the need for repeatedly cleaning off the oxide formed during the thinning process is avoided by using an electrolyte that dissolves the oxide as it is formed. This avoids the build-up of a thick oxide layer that requires a large voltage to pass appreciable current through it. In one technique, the pH starts at about 7, using the electrolyte solution described above in connection with FIG. 1. A voltage is applied and the wafer is dipped into the electrolyte to begin the build-up of an oxide film. Then the solution is altered, to raise or lower the pH to a level considerably alkaline or acidic, to provide a solution that dissolves the oxide film. For the above example of an electrolyte, additional ammonium hydroxide on the order of 1% of the total solution can be added to raise the pH to approximately 9, but specifically until the voltage rises very slowly (or descends) on account of oxide dissolving almost as fast (or faster) than it is being produced. The current level is then adjusted to a level that causes the formation of new oxide at the same rate as it is dissolved by the electrolyte. This can be accomplished by raising or lowering the current so that the voltage between the substrate 14 of the wafer and the electrolyte 20, remains constant. Of course, the power source must be capable of supplying sufficient voltage and current to maintain the desired levels of each. The pH should be less than about 4 or greater than about 8 to produce an appreciable rate of oxide dissolution.

In another method, the electrolyte 20 is initially far from neutral, with a pH of more than 8 or less than 4. At the time when the wafer 12 is initially immersed in the electrolyte, the lamp 22 is turned on and the power supply 38 is adjusted to supply more current than will later be applied. This results in a very rapid build-up of oxide, at a rate greater than it can be dissolved by the electrolyte, to initially create an oxide film of appreciable thickness that isolates the outer surface of the epitaxial layer 16 from direct long term contact with the electrolyte. The current then can be reduced to a level that produces a constant current at a constant voltage, so that the oxide layer grows (at its interface with the epitaxial layer 16), at substantially the same rate as the oxide layer is being dissolved (at its interface with the electrolyte). During all of these procedures, the breakdown voltage of the wafer can be monitored by briefly interrupting the application of light to the wafer, and measuring the change in voltage that occurs, either by the increase in voltage when the light is turned off or the decrease in voltage when the light is turned on. Of course, at the time of light interruption, the applied voltage must be low enough that the increase in voltage resulting from interruption of light will not result in a voltage exceeding that of the constant current power supply 38.

Thus, the invention provides a method for monitoring the breakdown voltage characteristics of a wafer. This is accomplished by measuring the change in voltage occurring across the epitaxial layer as measured between the substrate of the wafer and the surrounding electrolyte, when light is temporarily not shining on the layer. This can be accomplished by measuring the voltage drop when light is applied to the wafer, and/or by measuring the voltage rise which occurs when light suddenly ceases to be applied to the wafer. Alternatively, shortly after the wafer is initially dipped into an electrolyte, one can measure the voltage attained at the end of a fast rise that occurs immediately after immersion and before the occurrence of a sudden reduction in the rate of voltage increase. The thinning process can be facilitated by the use of an electrolyte which dissolves the oxide layer at approximately the same rate as new oxide is being formed.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. In a process for thinning a layer that lies on a substrate of a wafer, by passing a current from the substrate through the layer and into an electrolyte while shining light on the layer, to form an oxide film between the layer and electrolyte, a method for determining the breakdown voltage of diodes to be made from the wafer comprising:

establishing the wafer in an electrolyte and applying a constant current between the wafer substrate and electrolyte, switching between the shining of light on said layer and the avoidance of shining light, and measuring a sudden change in voltage between a location on the substrate and the electrolyte, that accompanies the switching, and stopping the process of applying current when the voltage change is approximately the same as the desired breakdown voltage of diodes to be made from the wafer.

2. The process described in claim 1 wherein
    said electrolyte is a solution that dissolves the oxide film, and including applying current through said layer in an amount that produces oxide at the layer-film interface at about the rate as oxide is dissolved at the film-electrolyte interface.

3. The process described in claim 1 including:
    illuminating said wafer with light while passing current through it to form an oxide layer, removing the oxide layer, again switching between the shining of light and the avoidance thereof and measuring a sudden voltage change, and repeating the steps of illuminating, removing oxide, switching, and measuring a sudden voltage change, until the sudden voltage change is slightly more than the minimum acceptable breakdown voltage of a Schottky diode to be formed from the wafer.

4. A process for thinning a layer that lies on a gallium arsenide substrate of a wafer, to produce a wafer from which diodes can be produced that have a predetermined diode breakdown voltage, comprising:

immersing said wafer in an electrolyte, applying a constant current to flow through the interface between said layer and said electrolyte, and applying light to said interface including switching said light between on and off states;

measuring the voltage between said electrolyte and the substrate of said wafer, including measuring the voltage change that occurs when said light is switched; and stopping the process of applying current when said voltage change is less than a predetermined amount which is approximately equal to said predetermined diode breakdown voltage.

5. In a process for thinning an epitaxial layer that lies on a substrate of a wafer, by passing a current from the substrate through the layer and into an electrolyte while shining light on the layer, to form an oxide film between the epitaxial layer and electrolyte, a method for determining the breakdown voltage of diodes to be made from the wafer comprising:

immersing a wafer which has an oxide-free epitaxial layer, in an electrolyte, and applying a constant current between the wafer substrate and electrolyte, avoiding the shining of bright light on said layer, and measuring the voltage between a location on the substrate and the electrolyte, including measuring the value to which voltage rapidly rises after a first voltage drop taking place immediately after the wafer is immersed with the electricity source connected, and stopping the process of applying current when the value to which the voltage rapidly rises is approximately the same as the desired breakdown voltage of diodes to be made from the wafer.

6. The process described in claim 5 wherein:
said step of measuring includes measuring the value to which voltage rises at a first rapid rate and until the beginning of a sudden decrease in the rate of voltage increase.

7. A process for thinning an epitaxial layer that lies on a gallium arsenide substrate of a wafer, to produce a wafer from which diodes can be produced that have a predetermined diode breakdown voltage, comprising:
repeatedly immersing said wafer into an electrolyte, applying a constant current to flow through the interface between said epitaxial layer and said electrolyte, applying light to said interface to oxidize the surface of said layer at said interface to form an oxide film thereon, removing said wafer from said electrolyte, cleaning off the film of oxide, and again performing said step of immersing said wafer;
measuring the voltage between said electrolyte and the substrate of said wafer, including measuring a primary voltage that is reached by a rapid rise immediately after a rapid voltge drop following said step of immersion into said electrolyte and prior to applying light, and immediately prior to a second voltage rise at a much slower rate; and
stopping the process of repeatedly immersing in the electrolyte when said primary voltage is less than a predetermined amount which is approximately equal to said predetermined diode breakdown voltage.

8. A method for thinning an epitaxial layer of a wafer that lies on a substrate of the wafer, comprising:
immersing said wafer in an electrolyte which does not appreciably dissolve an oxide of the epitaxial layer material;
applying a current between said substrate and electrolyte through said epitaxial layer, to oxidize said layer at the layer-electrolyte interface, to form an oxide film thereat; and
changing the composition of said electrolyte to a solution that dissolves said oxide film, and applying a current at a level that forms new oxide at the layer surface closest to the oxide, about as fast as oxide is dissolved at the oxide film surface that is closest to the electrolyte.

9. The method described in claim 8 wherein
said step of changing the composition and applying a current after the composition of the electrolyte is changed, includes maintaining a largely constant voltage between the wafer and electrolyte, whereby to maintain a substantially constant oxide film thickness.

10. The method described in claim 8 wherein:
said wafer and epitaxial layer are each of gallium arsenide, the initial composition of said electrolyte prior to immersing said wafer therein consists of approximately 1% tartaric acid powder, 1% ammonium hydroxide, 67% ethylene glycol, and the remainder water, to obtain a pH of about 7; and
said step of changing the composition of said electrolyte includes adding on the order of 1% more ammonium hydroxide, to increase the pH of the electrolyte to a pH of about 9 or more.

11. A method for thinning an epitaxial layer of a wafer that lies on a substrate of the wafer, comprising:
immersing said wafer in an electrolyte which dissolves an oxide of the epitaxial layer material; and
applying a current between said substrate and electrolyte through said epitaxial layer, of a current level which forms oxide faster than said electrolyte dissolves oxide, to build up an oxide film of appreciable thickness, and then decreasing the current to a level that forms new oxide about as fast as oxide is dissolved.

* * * * *